US012805097B2

(12) United States Patent
Zhou et al.

(10) Patent No.: US 12,805,097 B2
(45) Date of Patent: Nov. 17, 2026

(54) DISPLAY PANEL, PREPARATION METHOD THEREOF AND DISPLAY DEVICE

(71) Applicant: TCL CHINA STAR OPTOELECTRONICS TECHNOLOGY CO., LTD., Shenzhen (CN)

(72) Inventors: Xiaobo Zhou, Shenzhen (CN); Xueyong Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 447 days.

(21) Appl. No.: 18/496,913

(22) Filed: Oct. 29, 2023

(65) Prior Publication Data

US 2025/0113683 A1 Apr. 3, 2025

(30) Foreign Application Priority Data

Sep. 28, 2023 (CN) ......................... 202311285227.0

(51) Int. Cl.
*H10H 29/14* (2025.01)
*H10H 20/851* (2025.01)
*H10H 20/855* (2025.01)

(52) U.S. Cl.
CPC ...... *H10H 29/142* (2025.01); *H10H 20/8514* (2025.01); *H10H 20/855* (2025.01)

(58) Field of Classification Search
CPC ............. H10H 29/142; H10H 20/8514; H10H 20/855; H10H 20/0361; H10H 20/8516; H10H 20/882; H10W 90/00; G09F 9/33
See application file for complete search history.

(56) References Cited

U.S. PATENT DOCUMENTS

2020/0203320 A1* 6/2020 Yang ...................... H10W 90/00
2020/0335575 A1* 10/2020 Dong .................... H10K 59/131
2023/0240098 A1* 7/2023 Lee ......................... H10K 59/38
2023/0411568 A1* 12/2023 Lee ..................... H10H 20/8514
2024/0063347 A1* 2/2024 Baeck ................. H10H 20/8513

* cited by examiner

*Primary Examiner* — Kevin Quarterman
(74) *Attorney, Agent, or Firm* — PV IP PC; Christopher S. Ruprecht; Wei Te Chung

(57) ABSTRACT

Provided is a display panel including light-emitting unit package, which includes: a transparent substrate, a light shielding layer, a quantum dot layer and a light-emitting unit layer. The light shielding layer includes multiple first openings, multiple second openings, and multiple third openings. The quantum dot layer includes multiple first quantum dot units and multiple second quantum dot units. Each first quantum dot unit is correspondingly disposed in each first opening. Each second quantum dot unit is correspondingly disposed in each second opening. The light-emitting unit layer includes multiple first light-emitting units, multiple second light-emitting units, and multiple third light-emitting units with the same light-emitting color, each first light-emitting unit, each second light-emitting unit, and each third light-emitting unit are disposed corresponding to each first opening, each second opening, and each third opening, respectively.

19 Claims, 2 Drawing Sheets

DISPLAY PANEL, PREPARATION METHOD THEREOF AND DISPLAY DEVICE

CROSS-REFERENCE TO RELATED APPLICATION

The present disclosure claims priority to and the benefit of Chinese Patent Application No. 202311285227.0, filed on Sep. 28, 2023, the disclosure of which is incorporated herein by reference in its entirety.

TECHNICAL FIELD

The present disclosure relates to the technical field of display, and in particular, to a display panel, a preparation method thereof and a display device.

BACKGROUND

Mini light-emitting diode (mini LED) and micro light-emitting diode (micro LED) are collectively called M-LED. In recent two years, M-LED display technology has entered an accelerated development stage, and has been gradually applied to small and medium-sized display fields with high added value. Compared with organic light-emitting diode (OLED) display screens, M-LED display screens show better advantages in cost, contrast, brightness and appearance.

Currently, one of the mass production solutions of M-LED display panels is realized by a mass transfer method in which the M-LED units with three light-emitting colors are directly transferred in batches. Due to the difficulty and poor maturity of mass transfer technology, there are some problems such as low yield of packaging process, too long repair time and poor display uniformity when transferring in batches. In addition, since the size of the M-LED unit is too small, it is impossible to split light and color, combining with the fact that the consistency of the wavelength and brightness of current wafer is difficult to control, it is difficult for the M-LED display panels to achieve uniform display effects through M-LED unit with three light-emitting colors. This problem needs to be solved urgently.

SUMMARY

The present disclosure provides a display panel and a preparation method thereof, which can effectively solve the technical problems of difficult manufacturing process and poor display uniformity of existing M-LED display panels.

According to a first aspect, the present disclosure provides a display panel including at least one light-emitting unit package. The at least one light-emitting unit package includes a transparent substrate, a light shielding layer disposed on a first side of the transparent substrate, a quantum dot layer disposed on a first side of the transparent substrate, and a light-emitting unit layer disposed on one side of the quantum dot layer away from the transparent substrate. The light shielding layer includes a plurality of first openings, a plurality of second openings, and a plurality of third openings. The quantum dot layer includes a plurality of first quantum dot units and a plurality of second quantum dot units, each of the plurality of first quantum dot units is correspondingly disposed in each of the plurality of first openings; and each of the plurality of second quantum dot unit is correspondingly disposed in each of the plurality of second openings. The light-emitting unit layer includes a plurality of first light-emitting units, a plurality of second light-emitting units, and a plurality of third light-emitting units with a same light-emitting color, each of the plurality of first light-emitting units, each of the plurality of second light-emitting units, and each of the plurality of third light-emitting units is disposed corresponding to each of the plurality of first openings, each of the plurality of second openings, and each of the plurality of third openings, respectively.

Optionally, the light-emitting unit package further includes a color filter layer disposed between the transparent substrate and the quantum dot layer and a transparent adhesive layer disposed on one side of the quantum dot layer away from the transparent substrate. The color filter layer includes a plurality of first color filter units and a plurality of second color filter units, each of the plurality of first color filter units is correspondingly disposed in each of the plurality of first openings, and each of the plurality of second color filter units is correspondingly disposed in each of the plurality of second openings. The transparent adhesive layer includes a plurality of first transparent adhesive units, a plurality of second transparent adhesive units and a plurality of third transparent adhesive units, each of the plurality of first transparent adhesive units is correspondingly disposed in each of the plurality of first openings, each of the plurality of second transparent adhesive units is correspondingly disposed in each of the plurality of second openings, each of the plurality of third transparent adhesive units is correspondingly disposed in each of the plurality of third openings, and the light-emitting unit layer is disposed on one side of the transparent adhesive layer away from the transparent substrate and is fixedly connected with the light shielding layer through the transparent adhesive layer.

Optionally, the transparent adhesive layer includes a base material, and a material of the base material is hot melt adhesive.

Optionally, the transparent adhesive layer further includes light scattering particles doped in the base material.

Optionally, the color filter layer further includes a plurality of third color filter units, each of the plurality of third color filter units is correspondingly disposed in each of the plurality of third openings and is disposed between each of the plurality of third transparent adhesive units and the transparent substrate.

Optionally, the light-emitting unit package further includes a lens layer disposed in a same layer as the quantum dot layer. The lens layer includes a plurality of lens units correspondingly disposed in each of the plurality of third openings, each of the plurality of lens units is disposed between each of the plurality of third transparent adhesive units and each of the plurality of third color filter units, and wherein one side of each of the plurality of lens units away from the transparent substrate is convex.

Optionally, a refractive index of each of the plurality of lens units is greater than that of each of the plurality of third transparent adhesive units.

Optionally, one side of each of the plurality of first quantum dot units away from the transparent substrate and one side of each of the plurality of second quantum dot units away from the transparent substrate are convex.

Optionally, a distance between a surface of the transparent adhesive layer away from the transparent substrate and the transparent substrate is a first distance. A distance between a surface of the light shielding layer away from the transparent substrate and the transparent substrate is a second distance. The first distance may be equal to the second distance, in this case, each of the plurality of first light-emitting units, each of the plurality of second light-emitting units, and each of the plurality of third light-emitting units are disposed outside each of the plurality of first openings, each of the plurality of second openings, and each of the plurality of third openings, respectively. Alternatively, the first distance is less than the second distance. In this case, a portion of each of the plurality of first light-emitting units is disposed within each of the plurality of first openings, and a remaining portion of each of the plurality of first light-emitting units is disposed outside each of the plurality of first openings; a portion of each of the plurality of second light-emitting units is disposed within each of the plurality of second openings, and a remaining portion of each of the plurality of second light-emitting units is disposed outside each of the plurality of second openings; and a portion of each of the plurality of third light-emitting units is disposed within each of the plurality of third openings, and a remaining portion of each of the plurality of third light-emitting units is disposed outside each of the plurality of third openings. Alternatively, the first distance is less than the second distance. In this case, each of the plurality of first light-emitting units is disposed within each of the plurality of first openings, each of the plurality of second light-emitting units is disposed within each of the plurality of second openings, and each of the plurality of third light-emitting units is disposed within each of the plurality of third openings.

Optionally, the light-emitting unit package further includes an insulating layer and a wiring layer. The insulating layer is disposed on one side of the light-emitting unit layer away from the transparent substrate. The wiring layer is disposed on one side of the insulating layer away from the transparent substrate. The insulating layer is provided with at least one hole at a position corresponding to each of the plurality of first light-emitting units, at least one hole at a position corresponding to each of the plurality of second light-emitting units, and at least one hole at a position corresponding to each of the plurality of third light-emitting units. The wiring layer includes a plurality of electrode units, each of the plurality of electrode units is electrically connected to each of the plurality of first light-emitting units, each of the plurality of second light-emitting units, or each of the plurality of third light-emitting units through the at least one hole.

Optionally, the display panel further includes a driving substrate. The at least one light-emitting unit package is disposed on one side of the driving substrate in an array, and the transparent substrate is disposed on one side of the light-emitting unit layer away from the driving substrate.

According to a second aspect, the present disclosure further provides a display device including a housing and a display panel as described above. The housing has an accommodation space in which the display panel is disposed.

The present disclosure provides a display panel including at least one light-emitting unit package. The light-emitting unit package includes a transparent substrate, a light shielding layer, a quantum dot layer, and a light-emitting unit layer. The light shielding layer is disposed on a first side of the transparent substrate. The light shielding layer includes a plurality of first openings, a plurality of second openings, and a plurality of third openings. The quantum dot layer is disposed on the first side of the transparent substrate. The quantum dot layer includes a plurality of first quantum dot units and a plurality of second quantum dot units. Each of the plurality of first quantum dot units is correspondingly disposed in each of the plurality of first openings. Each of the plurality of second quantum dot unit is correspondingly disposed in each of the plurality of second openings. The light-emitting unit layer is disposed on one side of the quantum dot layer away from the transparent substrate. The light-emitting unit layer includes a plurality of first light-emitting units, a plurality of second light-emitting units, and a plurality of third light-emitting units with a same light-emitting color. Each of the plurality of first light-emitting units, each of the plurality of second light-emitting units, and each of the plurality of third light-emitting units are disposed corresponding to each of the plurality of first openings, each of the plurality of second openings, and each of the plurality of third openings, respectively. According to the display panel and the display device provided in the present disclosure, since the first light-emitting units, the second light-emitting units and the third light-emitting units emit light of the same color, during the actual preparation process, there is no need to respectively transfer red, green, and blue light-emitting units through mass transfer, which reduces the process difficulty. In addition, the combination of a monochromatic light-emitting unit layer and a quantum dot layer to realize color display can effectively improve the problem of low consistency in light-emitting wavelength and brightness of the M-LED chip of different colors due to the small size of the M-LED chip, thereby improving the display uniformity of the display panel. Furthermore, the light shielding layer can enable the display panel to have an integrated black state in a non-display state, thus avoiding color crosstalk in a display state, realizing uniform surface light-emitting effect, and improving the color difference problem easily generated by a side viewing angle display panel.

BRIEF DESCRIPTION OF THE DRAWINGS

In order to more clearly describe the technical solutions in embodiments of the present disclosure or in the related art, the drawings used for describing the embodiments or the related art will be briefly introduced below. Apparently, the drawings described below are only directed to some embodiments of the present disclosure, and for a person with ordinary skills in the art, without expenditure of creative labor, other drawings can be derived on the basis of these drawings.

LIST OF REFERENCE SIGNS

Figure 1:
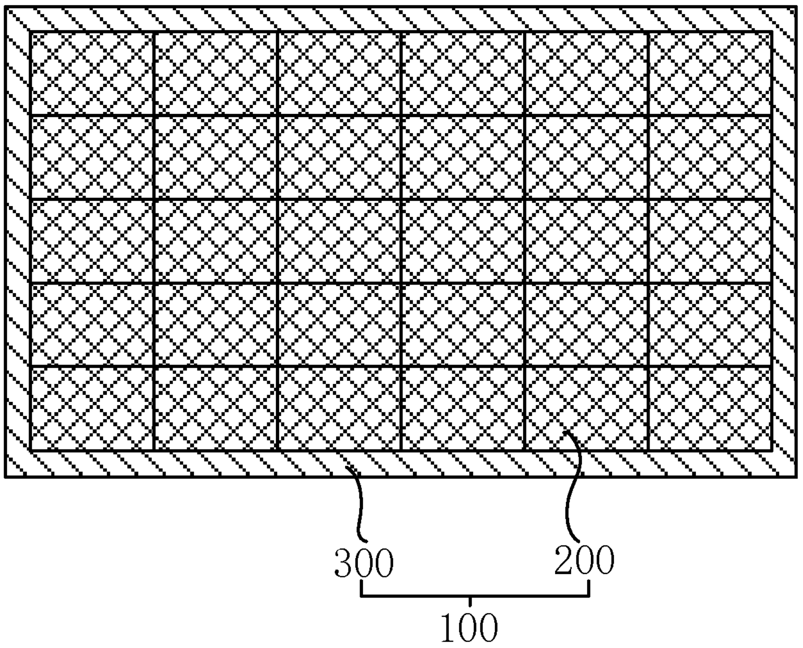
FIG. 1 is a schematic plan view of a display panel according to Embodiment 1 of the present disclosure.

100: Display panel; 200: Light-emitting unit package; 300: Driving substrate; 10: Transparent substrate; 101: First side; 20: Light shielding layer; 21: First opening; 22: Second opening; 23: Third opening; 30: Color filter layer; 31: First color filter unit; 32: Second color filter unit; 33: Third color filter unit; 40: Quantum dot layer; 41: First quantum dot unit; 42: Second quantum dot unit; 50: Transparent adhesive layer; 51: First transparent adhesive unit; 52: Second transparent adhesive unit; 53: Third transparent adhesive unit; 60: Light-emitting unit layer; 61: First light-emitting unit; 62: Second light-emitting unit; 63: Third light-emitting unit; 70: Insulating layer; 71: Hole; 80: Wiring layer; 81: Electrode unit; 90: Lens layer; 91: Lens units; d1: First distance; d2: Second distance.

DETAILED DESCRIPTION

Hereinafter, technical solutions in examples of the present disclosure will be clearly and completely described with reference to the accompanying drawings in examples of the present disclosure. Apparently, the described examples are part of, but not all of, the examples of the present disclosure. All the other examples, obtained by a person with ordinary skill in the art on the basis of the examples in the present disclosure without expenditure of creative labor, belong to the protection scope of the present disclosure. In addition, it should be understood that specific embodiments described herein are only used to illustrate and explain the present disclosure, and are not intended to limit the present disclosure. In the present disclosure, unless otherwise stated, orientation words such as "up" and "down" generally refers to "up" and "down" in the actual use or working state of a device, and specifically refers to the drawing direction in the drawings; while "inside" and "outside" refer to outline of a device.

The following description provides different embodiments or examples for implementing different structures of the present disclosure. In order to simplify the present disclosure, components and arrangements of specific examples are described below. It is clear that they are merely examples and are not intended to limit the present disclosure. In addition, reference numerals and/or reference letters are repeated in different examples. Such repetition is for the purpose of simplification and clarity, and it does not indicate the relationship between the various embodiments and/or settings discussed. Furthermore, the present disclosure provides examples of various specific processes and materials, but people of ordinary skill in the art may be aware of the application of other processes and/or the use of other materials. In the following detailed description, it is to be noted that the order in which the following embodiments are described is not intended to limit the preferred order of the embodiments.

Embodiment 1

Figure 2:
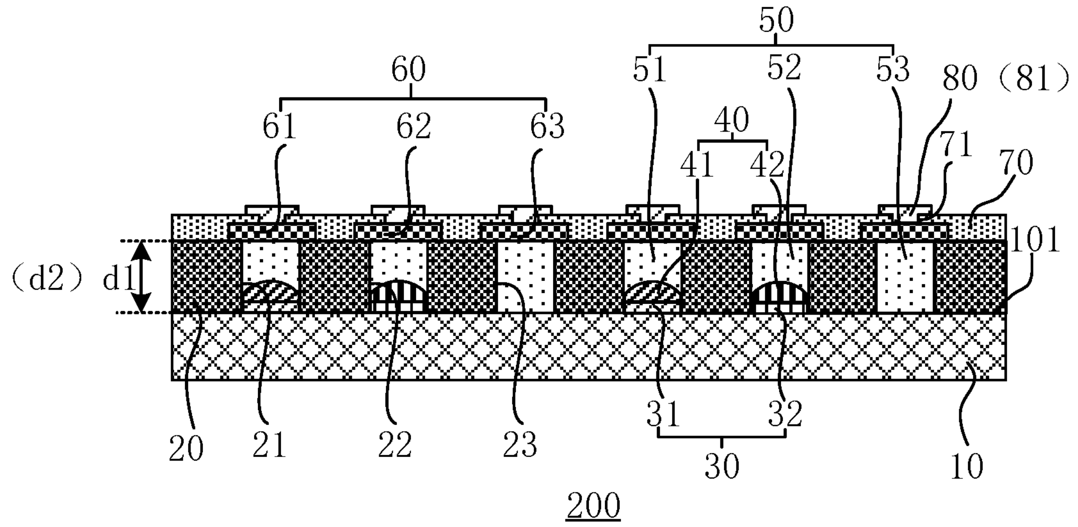
FIG. 2 is a schematic cross-sectional view of a light-emitting unit package according to Embodiment 1 of the present disclosure.

FIG. 1 is a schematic plan view of a display panel according to Embodiment 1 of the present disclosure; FIG. 2 is a schematic cross-sectional view of a light-emitting unit package according to Embodiment 1 of the present disclosure. As shown in FIG. 1 and FIG. 2, in a first aspect, Embodiment 1 of the present disclosure provides a display panel 100. The display panel 100 includes at least one light-emitting unit package 200. The light-emitting unit package 200 includes a transparent substrate 10, a light shielding layer 20, a quantum dot layer 40, and a light-emitting unit layer 60. The light shielding layer 20 is disposed on a first side 101 of the transparent substrate 10. The light shielding layer 20 includes a plurality of first openings 21, a plurality of second openings 22, and a plurality of third openings 23. The quantum dot layer 40 is disposed on one side of a color filter layer 30 away from the first side 101 of the transparent substrate 10. The quantum dot layer 40 includes a plurality of first quantum dot units 41 and a plurality of second quantum dot units 42. Each of the plurality of first quantum dot units 41 is correspondingly disposed in each of the plurality of first openings 21. Each of the plurality of second quantum dot units 42 is correspondingly disposed in each of the plurality of second openings 22. The light-emitting unit layer 60 is disposed on one side of a transparent adhesive layer 50 away from the transparent substrate 10. The light-emitting unit layer 60 includes a plurality of first light-emitting units 61, a plurality of second light-emitting units 62, and a plurality of third light-emitting units 63. Each of the plurality of first light-emitting units 61, each of the plurality of second light-emitting units 62, and each of the plurality of third light-emitting units 63 are disposed corresponding to each of the plurality of first openings 21, each of the plurality of second openings 22, and each of the plurality of third openings 23, respectively.

In the display panel 100 provided in the present disclosure, the light-emitting direction of the first light-emitting units 61, the second light-emitting units 62, and the third light-emitting units 63 may be direction of the light-emitting unit layer 60 in which the light-emitting unit layer 60 faces towards the transparent substrate 10. The first light-emitting unit 61, the second light-emitting unit 62, and the third light-emitting unit 63 have the same light-emitting color, and optionally, the light-emitting color of each of the first light-emitting unit 61, the second light-emitting unit 62, and the third light-emitting unit 63 is blue.

The first quantum dot unit 41 provided corresponding to the first light-emitting unit 61 is capable of exciting light of a first color, such as red, under the irradiation of the emitted light of the first light-emitting unit 61. Therefore, the first light-emitting unit 61 can realize red monochrome display in an area corresponding to the first opening 21 after the light conversion effect of the first quantum dot unit 41 in the first opening 21.

The second quantum dot unit 42 provided corresponding to the second light-emitting unit 62 is capable of exciting light of a second color, such as green, under the irradiation of the emitted light of the second light-emitting unit 62. Therefore, the second light-emitting unit 62 can realize green monochrome display in an area corresponding to the second opening 22 after the light conversion effect of the second quantum dot unit 42 in the second opening 22.

Since the quantum dot layer 40 is not provided in the third opening 23, the light emitted from the third light-emitting unit 63 will remain blue after it is emitted from the third opening 23, thus realizing the blue monochrome display in an area corresponding to the third opening 23.

Therefore, the display panel 100 is capable of displaying three colors of red, green, and blue in the area corresponding to the first opening 21, the second opening 22, and the third opening 23, respectively, thereby realizing color display.

Furthermore, since the light-emitting colors of the first light-emitting unit 61, the second light-emitting unit 62 and the third light-emitting unit 63 are the same, in the actual preparation process, there is no need to respectively transfer the red light-emitting unit, green light-emitting unit, and blue light-emitting unit respectively through mass transfer, which reduces the process difficulty. In the transfer process of the first light-emitting unit 61, the second light-emitting unit 62 and the third light-emitting unit 63, it is only necessary to ensure that the first light-emitting unit 61 covers at least the first opening 21, the second light-emitting unit 62 covers at least the second opening 22, and the third light-emitting unit 63 covers at least the third opening 23, which reduces the transfer accuracy requirements of each light-emitting unit and reduces the transfer difficulty.

In addition, color display is realized by combining the monochromatic light-emitting unit layer 60 with the quantum dot layer 40, which can effectively solve the problem of low consistency in wavelength and brightness of M-LED chips with different colors due to small sizes of the M-LED chips, and improve the display uniformity of the display panel.

it is possible to effectively improve the display uniformity of the display panel because the M-LED chip size (for example, less than 50 microns) is too small, and the M-LED chip with different colors has a low uniformity of light emission wavelength and brightness.

Furthermore, since the light shielding layer 20 is disposed between the light-emitting unit layer 60 and the transparent substrate 10, the light shielding layer 20 enables the display panel 100 to have an integrated black state in a non-display state, which is more beautiful. In addition, the first opening 21, the second opening 22, and the third opening 23 in the light shielding layer 20 are disposed independently, so that color cross-talk in the display state can be avoided, uniform surface light-emitting effect can be achieved, and the color difference problem easily generated by a side viewing angle display panel 100 can be improved.

In some embodiments of the present disclosure, the sizes of the first light-emitting units 61, the second light-emitting units 62, and the third light-emitting units 63 provided in the present disclosure are all less than or equal to 50 microns, that is, the present disclosure can focus on improving the problem of low consistency in light-emitting wavelength and brightness of M-LED chips of different colors due to small sizes of the M-LED chips.

In some embodiments of the present disclosure, the light-emitting unit package 200 further includes a color filter layer 30 disposed between the transparent substrate 10 and the quantum dot layer 40. The color filter layer 30 includes a plurality of first color filter units 31 and a plurality of second color filter units 32. Each of the plurality of first color filter units 31 is correspondingly disposed in each of the plurality of first openings 21, and each of the plurality of second color filter units 32 is correspondingly disposed in each of the plurality of second openings 22.

In the display panel 100 provided in the present disclosure, the first color filter units 31 can transmit light of the first color, for example, red, and absorb the light of other colors except the light of the first color. The second color filter units 32 can transmit light of the second color, for example, green, and absorb light of other colors than the light of the second color.

In some embodiments of the present disclosure, the first quantum dot unit 41 is capable of generating light of other colors except red light under the excitation of blue light. Since the first color filter units 31 are capable of absorbing light of other colors except red light, the display effect of the display panel 100 can be ensured. The second quantum dot unit 42 is capable of generating light of other colors except green light under excitation of blue light. Since the second color filter units 32 are capable of absorbing light of other colors except green light, the display effect of the display panel 100 can be ensured.

Furthermore, the first quantum dot units 41 and the second quantum dot units 42 are made of the same material, including red quantum dots and green quantum dots. That is, both the first quantum dot units 41 and the second quantum dot units 42 are capable of generating red light and green light under excitation of blue light, thereby reducing types of materials and improving process efficiency.

In some embodiments of the present disclosure, the light-emitting unit package 200 further includes a transparent adhesive layer 50 disposed on one side of the quantum dot layer 40 away from the transparent substrate 10. The transparent adhesive layer 50 includes a plurality of first transparent adhesive units 51, a plurality of second transparent adhesive units 52, and a plurality of third transparent adhesive units 53. Each of the plurality of first transparent adhesive units 51 is correspondingly disposed in each of the plurality of first openings 21. Each of the plurality of second transparent adhesive units 52 is correspondingly disposed in each of the plurality of second openings 22. Each of the plurality of third transparent adhesive units 53 is correspondingly disposed in each of the plurality of third openings 23. The light-emitting unit layer 60 is disposed on one side of the transparent adhesive layer 50 away from the transparent substrate and is fixedly connected with the light shielding layer 20 through the transparent adhesive layer 50.

In the display panel 100 provided in the present disclosure, since the light-emitting unit layer 60 is disposed on the side of the transparent adhesive layer 50 away from the transparent substrate 10, and the light-emitting unit layer 60 is fixedly connected with the light shielding layer 20 through the transparent adhesive layer 50, the first light-emitting unit 61 and the light shielding layer 20 can be held relatively fixed by using the first transparent adhesive unit 51 in the transparent adhesive layer 50, the second light-emitting unit 62 and the light shielding layer 20 can be held relatively fixed by using the second transparent adhesive unit 52 in the transparent adhesive layer 50, and the third light-emitting unit 63 and the light shielding layer 20 can be held relatively fixed by using the third transparent adhesive unit 53 in the transparent adhesive layer 50, thereby ensuring the assembly stability of the first light-emitting unit 61, the second light-emitting unit 62 and the third light-emitting unit 63, and prolonging service life of the display panel 100.

In some embodiments of the present disclosure, the transparent adhesive layer 50 includes a base material, and a material of the base material is hot melt adhesive.

In the display panel 100 provided in the present disclosure, since the base material of the transparent adhesive layer 50 is a hot melt adhesive, the hot melt adhesive can achieve reversible viscosity change such as viscosity recovery and viscosity loss by heating or laser irradiation, thereby improving the repair efficiency of the display panel 100.

In some embodiments of the present disclosure, the transparent adhesive layer 50 further includes light scattering particles doped in the base material.

In the display panel 100 provided in the present disclosure, since the first opening 21, the second opening 22, and the third opening 23 are respectively provided with the first translucent adhesive unit 51, the second translucent adhesive unit 52, and the third translucent adhesive unit 53, and the transparent adhesive layer 50 further includes light scattering particles doped in the base material, it is possible to make the light emitted from the first opening 21, the second opening 22, and the third opening 23 more uniform, the lamp shadow problem can be improved, and the display uniformity can be further improved.

In some embodiments of the present disclosure, the light-emitting unit layer 60 is disposed on a surface of the transparent adhesive layer 50 away from the transparent substrate 10. A distance between a surface of the transparent adhesive layer 50 away from the transparent substrate 10 and the transparent substrate 10 is a first distance d1. A distance between a surface of the light shielding layer 20 away from the transparent substrate 10 and the transparent substrate 10 is a second distance d2. The first distance d1 is equal to the second distance d2. In this case, the first light-emitting unit 61, the second light-emitting unit 62, and the third light-emitting unit 63 are disposed outside the first opening 21, the second opening 22, and the third opening 23, respectively. An orthographic projection of the first light-emitting unit 61 on the light shielding layer 20 overlaps with a portion of the light shielding layer 20. An orthographic projection of the second light-emitting unit 62 on the light shielding layer 20 overlaps with a portion of the light shielding layer 20. An orthographic projection of the third light-emitting unit 63 on the light shielding layer 20 overlaps with a portion of the light shielding layer 20.

In the display panel 100 provided in the present disclosure, since the first light-emitting unit 61, the second light-emitting unit 62, and the third light-emitting unit 63 are disposed outside the first opening 21, the second opening 22, and the third opening 23, respectively; and the orthographic projection of the first light-emitting unit 61 on the light shielding layer 20 overlaps with a portion of the light shielding layer 20, the orthographic projection of the second light-emitting unit 62 on the light shielding layer 20 overlaps with a portion of the light shielding layer 20, and the orthographic projection of the third light-emitting unit 63 on the light shielding layer 20 overlaps with a portion of the light shielding layer 20; the area of the first light-emitting unit 61 is greater than the area of the first opening 21, the area of the second light-emitting unit 62 is greater than the area of the second opening 22, and the area of the third light-emitting unit 63 is greater than the area of the third opening 23, so that the arrangement area of the first light-emitting unit 61, the second light-emitting unit 62, and the third light-emitting unit 63 can be increased, the arrangement difficulty of the first light-emitting unit 61, the second light-emitting unit 62, and the third light-emitting unit 63 is reduced, and the process efficiency is improved. In addition, the arrangement areas of the first light-emitting unit 61, the second light-emitting unit 62, and the third light-emitting unit 63 are increased, which can also reduce the arrangement difficulty and the alignment difficulty of the electrode units 81 in the wiring layer 80 when the wiring layer 80 is subsequently disposed on one side of the light-emitting unit layer 60 away from the transparent substrate 10, thereby further improving process efficiency.

In some embodiments of the present disclosure, the light-emitting unit package 200 further includes an insulating layer 70 disposed on one side of the light-emitting unit layer 60 away from the transparent substrate 10. The insulating layer 70 is provided with at least one hole 71 at a position corresponding to each first light-emitting unit 61, at least one hole 71 at a position corresponding to each second light-emitting unit 62, and at least one hole 71 at a position corresponding to each third light-emitting unit 63.

In the display panel 100 provided in the present disclosure, the insulating layer 70 can seal the first light-emitting unit 61, the second light-emitting unit 62, and the third light-emitting unit 63 in the light-emitting unit layer 60, thereby improving the stability of the display panel 100 and prolonging the service life of the display panel 100. Furthermore, since the insulating layer 70 is provided with at least one hole 71 at a position corresponding to each first light-emitting unit 61, at least one hole 71 at a position corresponding to each second light-emitting unit 62, and at least one hole 71 at a position corresponding to each third light-emitting unit 63, it is possible to enable the electrode units 81 in the wiring layer 80 to pass through the holes 71 and communicate with the corresponding first light-emitting unit 61, the second light-emitting unit 62, or the third light-emitting unit 63 when the wiring layer 80 is subsequently disposed on the side of the light-emitting unit layer 60 away from the transparent substrate 10.

In some embodiments of the present disclosure, the light-emitting unit package 200 further includes a wiring layer 80 disposed on one side of the insulating layer 70 away from the transparent substrate 10. The wiring layer 80 includes a plurality of electrode units 81. Each of the plurality of electrode units 81 is electrically connected to each of the plurality of first light-emitting units 61, each of the plurality of second light-emitting units 62, or each of the plurality of third light-emitting units 63 through the holes 71.

In the display panel 100 provided in the present disclosure, the electrode unit 81 is used to be electrically connected with a subsequently formed driving substrate 300, so as to drive the first light-emitting unit 61, the second light-emitting unit 62, or the third light-emitting unit 63 to emit light through the driving substrate 300.

In some embodiments of the present disclosure, the display panel 100 further includes a driving substrate 300, the at least one light-emitting unit package is disposed on one side of the driving substrate 300 in an array, and the transparent substrate 10 is disposed on one side of the light-emitting unit 60 layer away from the driving substrate 300.

In the display panel 100 provided in the present disclosure, the driving substrate 300 is used to drive the first light-emitting units 61, the second light-emitting units 62, and the third light-emitting light units 63 to emit light. Optionally, the driving substrate 300 includes a base and a driving circuit layer disposed on the base. The driving circuit layer includes various types of wirings and a plurality of thin film transistors.

In some embodiments of the present disclosure, the display panel 100 includes a plurality of the light-emitting unit packages 200 disposed in an array on one side of the driving substrate 300.

In the display panel 100 provided in the present disclosure, the size of the driving substrate 300 may be freely set, and the plurality of light-emitting unit packages 200 disposed in an array on one side of the driving substrate 300 may be any number, so that panel manufacturers can freely set the size of the driving substrate 300 and the number of light-emitting unit packages 200 on the driving substrate 300 according to the needs of users, and combine them into a display panel 100 with any resolution, thus improving the freedom of product design.

In a second aspect, Embodiment 1 of the present disclosure further provides a method for preparing a display panel 100. The preparation method of the display panel 100 may include step S01, step S02, step S03, step S04, step S05, step S06, step S07, step S08, step S09, step S10, and step S11.

Step S01 includes providing a transparent substrate 10.

Step S02 includes forming a light shielding layer 20 on the transparent substrate 10. The light shielding layer 20 includes a plurality of first openings 21, a plurality of second openings 22, and a plurality of third openings 23.

Step S03 includes forming a color filter layer 30 on the transparent substrate 10. The color filter layer 30 includes a plurality of first color filter units 31 and a plurality of second color filter units 32, wherein each of the plurality of first color filter units 31 is correspondingly disposed in each of the plurality of first openings 21, and each of the plurality of second color filter units 32 is correspondingly disposed in each of the plurality of second openings 22.

Step S04 includes forming a quantum dot layer 40 on one side of the color filter layer 30 away from the transparent substrate 10. The quantum dot layer 40 includes a plurality of first quantum dot units 41 and a plurality of second quantum dot units 42, wherein each of the plurality of first quantum dot units 41 is correspondingly disposed in each of the plurality of first openings 21; and each of the plurality of second quantum dot units 42 is correspondingly disposed in each of the plurality of second openings 22.

Step S05 includes forming a transparent adhesive layer 50 on one side of the quantum dot layer 40 away from the transparent substrate 10. The transparent adhesive layer 50 includes a plurality of first transparent adhesive units 51, a plurality of second transparent adhesive units 52, and a plurality of third transparent adhesive units 53, wherein each of the plurality of first transparent adhesive units 51 is correspondingly disposed in each of the plurality of first openings 21, each of the plurality of second transparent adhesive units 52 is correspondingly disposed in each of the plurality of second openings 22, and each of the plurality of third transparent adhesive units 53 is correspondingly disposed in each of the plurality of third openings 23.

Step S06 includes forming a light-emitting unit layer 60 on one side of the transparent adhesive layer 50 away from the transparent substrate 10. The light-emitting unit layer 60 includes a plurality of first light-emitting units 61, a plurality of second light-emitting units 62, and a plurality of third light-emitting units 63. Each of the plurality of first light-emitting units 61, each of the plurality of second light-emitting units 62, and each of the plurality of third light-emitting units 63 are disposed corresponding to each of the plurality of first openings 21, each of the plurality of second openings 22, and each of the plurality of third openings 23, respectively. The light-emitting direction of the first light-emitting units 61, the second light-emitting units 62, and the third light-emitting units 63 is the direction in which the light-emitting unit layer 60 faces towards the transparent substrate 10.

Step S07 includes detecting the positions of the plurality of first light-emitting units 61, the plurality of second light-emitting units 62, and the plurality of third light-emitting units 63; adjusting the positions of the first light-emitting units 61, the second light-emitting units 62, and the third light-emitting units 63 with positional deviation; and thereafter enabling the transparent adhesive layer 50 to have a first viscosity by laser irradiation or heating, so that the first light-emitting units 61, the second light-emitting units 62, and the third light-emitting units 63 are fixedly connected with the transparent adhesive layer 50. The transparent adhesive layer 50 has a second viscosity before the light-emitting unit layer 60 is formed on the side of the transparent adhesive layer 50 away from the transparent substrate 10, and the second viscosity is less than the first viscosity.

Step S08 includes forming an insulating layer 70 on one side of the light-emitting unit layer 60 away from the transparent substrate 10, and forming at least one hole 71 at a position corresponding to each of the plurality of first light-emitting units 61, at least one hole 71 at a position corresponding to each of the plurality of second light-emitting units 62, and at least one hole 71 at a position corresponding to each of the plurality of third light-emitting units 63.

Step S09 includes forming a wiring layer 80 on the side of the insulating layer 70 away from the transparent substrate 10. The wiring layer 80 includes a plurality of electrode units 81, each of the plurality of electrode units 81 is electrically connected to each of the plurality of first light-emitting units 61, each of the plurality of second light-emitting units 62, or each of the plurality of third light-emitting units 63 through the holes 71. Optionally, after the preparation of the wiring layer 80 is completed, a large plate of the light-emitting unit package is formed.

Step S10 includes cutting the large plate of the light-emitting unit package to form a plurality of light-emitting unit packages 200 after forming the large plate of the light-emitting unit package.

Step S11 includes providing a driving substrate 300 after forming a plurality of light-emitting unit packages 200, disposing at least one of the light-emitting unit packages 200 on one side of the driving substrate 300, and disposing the transparent substrate 10 on one side of the light-emitting unit layer 60 away from the driving substrate 300.

According to a third aspect, Embodiment 1 of the present disclosure further provides a display device including a housing and the display panel 100 as described above. The housing has an accommodation space in which the display panel 100 is disposed.

Embodiment 2

Figure 3:
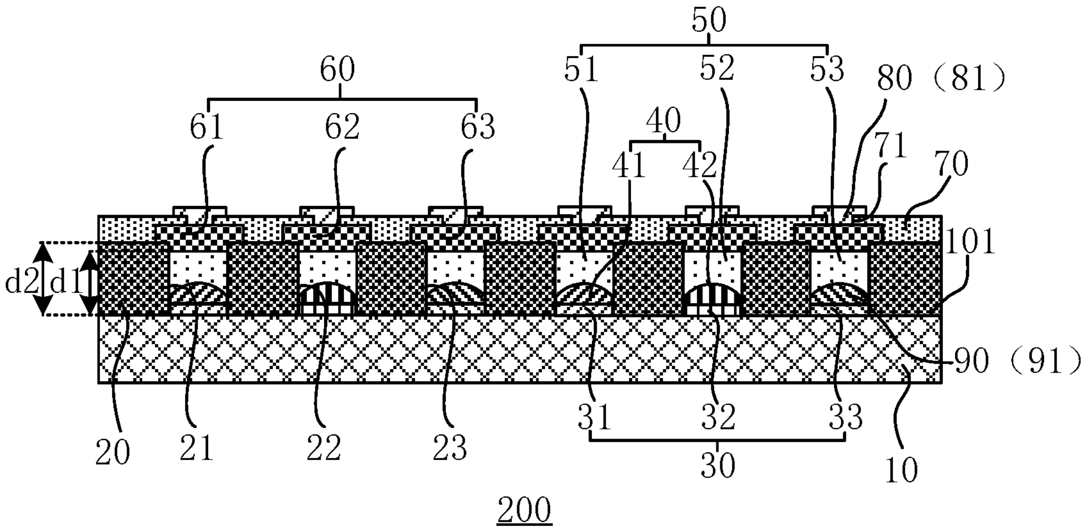
FIG. 3 is a schematic cross-sectional view of a light-emitting unit package according to Embodiment 2 of the present disclosure.

FIG. 3 is a schematic cross-sectional view of a light-emitting unit package according to Embodiment 2 of the present disclosure. As shown in FIG. 1 and FIG. 3, Embodiment 2 of the present disclosure provides a display panel 100 and a preparation method thereof, and a display device. The display panel 100 includes at least one light-emitting unit package 200. The light-emitting unit package 200 includes a transparent substrate 10, a light shielding layer 20, a quantum dot layer 40, and a light-emitting unit layer 60. The light shielding layer 20 is disposed on a first side 101 of the transparent substrate 10. The light shielding layer 20 includes a plurality of first openings 21, a plurality of second openings 22, and a plurality of third openings 23. The quantum dot layer 40 is disposed on one side of a color filter layer 30 away from the first side 101 of the transparent substrate 10. The quantum dot layer 40 includes a plurality of first quantum dot units 41 and a plurality of second quantum dot units 42. Each of the plurality of first quantum dot units 41 is correspondingly disposed in each of the plurality of first openings 21. Each of the plurality of second quantum dot units 42 is correspondingly disposed in each of the plurality of second openings 22. The light-emitting unit layer 60 is disposed on one side of a transparent adhesive layer 50 away from the transparent substrate 10. The light-emitting unit layer 60 includes a plurality of first light-emitting units 61, a plurality of second light-emitting units 62, and a plurality of third light-emitting units 63. Each of the plurality of first light-emitting units 61, each of the plurality of second light-emitting units 62, and each of the plurality of third light-emitting units 63 are disposed corresponding to each of the plurality of first openings 21, each of the plurality of second openings 22, and each of the plurality of third openings 23, respectively.

It should be noted that the display panel 100, the preparation method of the display panel 100, and the display device provided in Embodiment 2 of the present disclosure are similar to the display panel 100, the preparation method of the display panel 100, and the display device provided in Embodiment 1 of the present disclosure. Details of the same parts are not described in Embodiment 2 of the present disclosure.

The differences are that in the display panel 100 provided in Embodiment 2 of the present disclosure, the color filter layer 30 further includes a plurality of third color filter units

33, each of the plurality of third color filter units 33 is correspondingly disposed in each of the plurality of third openings 23 and between the third transparent adhesive unit 53 and the transparent substrate 10.

In the display panel 100 provided in the present disclosure, since the color filter layer 30 further includes a plurality of third color filter units 33 disposed in the third openings 23, the wavelength range of the blue light of the third light-emitting units 63 can be adjusted by the third color filter units 33, thereby improving the display effect of the display panel 100.

In some embodiments of the present disclosure, one side of each of the plurality of first quantum dot units 41 away from the transparent substrate 10 and one side of each of the plurality of second quantum dot units 42 away from the transparent substrate 10 are convex.

In the display panel 100 provided in the present disclosure, since one side of each of the plurality of first quantum dot units 41 away from the transparent substrate 10 and one side of each of the plurality of second quantum dot units 42 away from the transparent substrate 10 are convex, and the light-emitting direction of the first light-emitting units 61 and the second light-emitting units 62 is the direction in which the light-emitting unit layer 60 faces towards the transparent substrate 10, the light emitted from of the first light-emitting units 61 and the second light-emitting units 62 can be diverged and emitted after passing through the convex surface, thereby further improving the uniformity of the light emitted from the first openings 21 and the second openings 22, and improving the display effect.

Furthermore, since one side of each of the plurality of first quantum dot units 41 away from the transparent substrate 10 and one side of each of the plurality of second quantum dot units 42 away from the transparent substrate 10 are convex, the distance between the contact area between the first transparent adhesive unit 51 and the first quantum dot unit 41 is increased, and the contact area between the second transparent adhesive unit 52 and the second quantum dot unit 42 is increased, so that the connection stability between the first transparent adhesive unit 51 and the first quantum dot unit 41 can be improved, and the connection stability between the second transparent adhesive unit 52 and the second quantum dot unit 42 can be improved, thereby improving the assembly stability of the display panel 100, and prolonging the service life.

In some embodiments of the present disclosure, the light-emitting unit package 200 further includes a lens layer 90 disposed in the same layer as the quantum dot layer 40. The lens layer 90 includes a plurality of lens units 91 correspondingly disposed in each of the plurality of third openings 23. Each of the plurality of lens units 91 is disposed between each of the plurality of third transparent adhesive units 53 and each of the plurality of third color filter units 33. One side of each of the plurality of lens units 91 away from the transparent substrate 10 is convex.

In the display panel 100 provided in the present disclosure, since the side of each lens unit 91 disposed in each third opening 23 away from the transparent substrate 10 is convex, and the light-emitting direction of the third light-emitting unit 63 is the direction in which the light-emitting unit layer 60 faces towards the transparent substrate 10, the light emitted from the third light-emitting unit 63 can be diverged and emitted after passing through the convex surface, thereby further improving the uniformity of light emitted from the third opening 23, and improving the display effect.

Furthermore, since the side of each lens unit 91 disposed in each third opening 23 away from the transparent substrate 10 is convex, the contact area between the third transparent adhesive unit 53 and the lens unit 91 is increased, so that the connection stability between the third transparent adhesive unit 53 and the lens unit 91 can be improved, thereby improving the assembly stability of the display panel 100, and prolonging the service life.

In addition, since the lens unit 91 corresponding to the third opening 23 is disposed in the same layer as the quantum dot layer 40, the structure design in the third opening 23 can be made to be the same as the structure designs of the first opening 21 and the second opening 22, so that the amount of the transparent adhesive in the first opening 21, the second opening 22, and the third opening 23 tends to be consistent, which is beneficial to improving the process efficiency.

In some embodiments of the present disclosure, the refractive index of each of the plurality of lens units 91 is greater than that of each of the plurality of third transparent adhesive units 53.

In the display panel 100 provided in the present disclosure, since the refractive index of each of the plurality of lens units 91 is greater than that of each of the plurality of third transparent adhesive units 53, the exit angle of the light emitted from each third opening 23 can be increased, thereby further improving the uniformity of light emitted from each third opening 23 and improving the display effect.

In some embodiments of the present disclosure, the quantum dot layer 40 includes base materials and quantum dots doped in the base materials. The refractive index of the base materials of the quantum dot layer 40 is the same as the refractive index of the lens layer 90. That is, the refractive index of the base materials of the first quantum dot unit 41 is greater than the refractive index of the first transparent adhesive unit 51, and the refractive index of the base materials of the second quantum dot unit 42 is greater than the refractive index of the second transparent adhesive unit 52. Therefore, the exit angle of light emitted from the first opening 21 and the second opening 22 can be increased, thereby further improving the uniformity of light emitted from the third opening 23 and improving the display effect.

In some embodiments of the present disclosure, the distance between a surface of the transparent adhesive layer 50 away from the transparent substrate 10 and the transparent substrate 10 is a first distance d1, and the distance between a surface of the light shielding layer 20 away from the transparent substrate 10 and the transparent substrate 10 is a second distance d2. The first distance d1 is less than the second distance d2, in this case, a portion of each of the plurality of first light-emitting units 61 is disposed in each of the plurality of first openings 21, and a remaining portion of each of the plurality of first light-emitting units 61 is disposed outside each of the plurality of first openings 21; a portion of each of the plurality of second light-emitting units 62 is disposed in each of the plurality of second openings 22, and a remaining portion of each of the plurality of second light-emitting units 62 is disposed outside each of the plurality of second openings 22; and a portion of each of the plurality of third light-emitting units 63 is disposed in each of the plurality of third openings 23, and a remaining portion of each of the plurality of third light-emitting units 63 is disposed outside each of the plurality of third openings 23. Further, an orthographic projection of each first light-emitting unit 61 on the light shielding layer 20 overlaps with a portion of the light shielding layer 20, an orthographic projection of each second light-emitting unit 62 on the light shielding layer 20 overlaps with a portion of the light shielding layer 20, and an orthographic projection of each third light-emitting unit 63 on the light shielding layer 20 overlaps with a portion of the light shielding layer 20.

In the display panel 100 provided in the present disclosure, a portion of each first light-emitting unit 61 is disposed in each first opening 21, and a remaining portion of each first light-emitting unit 61 is disposed outside each first opening 21; a portion of each second light-emitting unit 62 is disposed in each second opening 22, and a remaining portion of each second light-emitting unit 62 is disposed outside each second opening 22; and a portion of each third light-emitting unit 63 is disposed in each third opening 23, and a remaining portion of each third light-emitting unit 63 is disposed outside each third opening 23. Further the orthographic projection of each first light-emitting unit 61 on the light shielding layer 20 overlaps with a portion of the light shielding layer 20, the orthographic projection of each second light-emitting unit 62 on the light shielding layer 20 overlaps with a portion of the light shielding layer 20, and the orthographic projection of each third light-emitting unit 63 on the light shielding layer 20 overlaps with a portion of the light shielding layer 20. As a result, the area of each first light-emitting unit 61 is greater than the area of each first opening 21, the area of each second light-emitting unit 62 is greater than the area of each second opening 22, and the area of each third light-emitting unit 63 is greater than the area of each third opening 23, so that the arrangement area of each first light-emitting unit 61, each second light-emitting unit 62, and each third light-emitting unit 63 can be increased, the arrangement difficulty of the first light-emitting unit 61, the second light-emitting unit 62, and the third light-emitting unit 63 is reduced, and the process efficiency is improved. In addition, the arrangement areas of the first light-emitting unit 61, the second light-emitting unit 62, and the third light-emitting unit 63 are increased, which can also reduce the arrangement difficulty and the alignment difficulty of the electrode units 81 in the wiring layer 80 when the wiring layer 80 is subsequently disposed on one side of the light-emitting unit layer 60 away from the transparent substrate 10, thereby further improving process efficiency.

Moreover, since the first distance d1 is less than the second distance d2, a portion of the first light-emitting unit 61, a portion of the second light-emitting unit 62, and a portion of the third light-emitting unit 63 in a the light-emitting unit layer 60 can be correspondingly embedded in the first opening 21, the second opening 22, and the third opening 23, so that the overall thickness of the display panel 100 can be reduced while the thickness of the insulating layer 70 remains unchanged, and the positioning accuracy of the first light-emitting unit 61, the second light-emitting unit 62, and the third light-emitting unit 63 can be improved. It is also possible to shorten the distance between the light-emitting unit layer 60 and the transparent substrate 10 without changing the thickness of the light shielding layer 20, thereby improving the light-emitting efficiency.

In the preparation method of the display panel 100 provided in the present disclosure, step S03 further includes disposing a color filter layer 30. The color filter layer 30 includes a plurality of third color filter units 33, and each third color filter unit 33 is correspondingly disposed in each second opening 22.

In the method of manufacturing the display panel 100 provided in the present disclosure, step S04 further includes forming a lens layer 90 on the side of the color filter layer 30 away from the transparent substrate 10. The lens layer 90 includes a plurality of lens units 91, each lens unit 91 is correspondingly disposed in each third opening 23.

Embodiment 3

Figure 4:
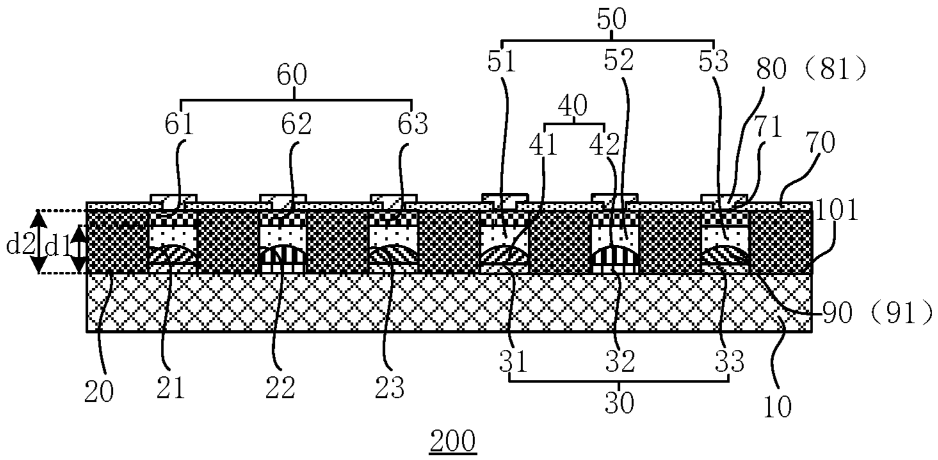
FIG. 4 is a schematic cross-sectional view of a light-emitting unit package according to Embodiment 3 of the present disclosure.

FIG. 4 is a schematic cross-sectional view of a light-emitting unit package according to Embodiment 3 of the present disclosure. As shown in FIG. 1 and FIG. 4, Embodiment 3 of the present disclosure provides a display panel 100 and a preparation method thereof, and a display device. The display panel 100 includes at least one light-emitting unit package 200. The light-emitting unit package 200 includes a transparent substrate 10, a light shielding layer 20, a quantum dot layer 40, and a light-emitting unit layer 60. The light shielding layer 20 is disposed on a first side 101 of the transparent substrate 10. The light shielding layer 20 includes a plurality of first openings 21, a plurality of second openings 22, and a plurality of third openings 23. The quantum dot layer 40 is disposed on one side of a color filter layer 30 away from the first side 101 of the transparent substrate 10. The quantum dot layer 40 includes a plurality of first quantum dot units 41 and a plurality of second quantum dot units 42. Each of the plurality of first quantum dot units 41 is correspondingly disposed in each of the plurality of first openings 21. Each of the plurality of second quantum dot units 42 is correspondingly disposed in each of the plurality of second openings 22. The light-emitting unit layer 60 is disposed on one side of a transparent adhesive layer 50 away from the transparent substrate 10. The light-emitting unit layer 60 includes a plurality of first light-emitting units 61, a plurality of second light-emitting units 62, and a plurality of third light-emitting units 63. Each of the plurality of first light-emitting units 61, each of the plurality of second light-emitting units 62, and each of the plurality of third light-emitting units 63 are disposed corresponding to each of the plurality of first openings 21, each of the plurality of second openings 22, and each of the plurality of third openings 23, respectively.

It should be noted that the display panel 100, the preparation method of the display panel 100, and the display device provided in Embodiment 3 of the present disclosure are similar to the display panel 100, the preparation method of the display panel 100, and the display device provided in Embodiment 2 of the present disclosure. Details of the same parts are not described in Embodiment 3 of the present disclosure.

The differences are that the distance between a surface of the transparent adhesive layer 50 away from the transparent substrate 10 and the transparent substrate 10 is a first distance d1, and the distance between a surface of the light shielding layer 20 away from the transparent substrate 10 and the transparent substrate 10 is a second distance d2. The first distance d1 is less than the second distance d2. Each of the plurality of first light-emitting units 61 is disposed in each of the plurality of first openings 21, each of the plurality of second light-emitting units 62 is disposed in each of the plurality of second openings 22, and each of the plurality of third light-emitting units 63 is disposed in each of the plurality of third openings 23.

In the display panel 100 provided in the present disclosure, the first distance d1 is less than the second distance d2, each first light-emitting unit 61 is disposed in each first opening 21, each second light-emitting unit 62 is disposed in each second opening 22, and each third light-emitting unit 63 is disposed in each third opening 23. As a result, the light-emitting unit layer 60 can be completely embedded in each first opening 21, each second opening 22, and each third opening 23, so that the overall thickness of the display panel 100 can be reduced. It is also possible to shorten the distance between the light-emitting unit layer 60 and the transparent substrate 10 without changing the thickness of the light shielding layer 20, thereby improving the light-emitting efficiency.

In view of above, the present disclosure provides a display panel and a preparation method thereof, and a display device. The display panel includes at least one light-emitting unit package. The light-emitting unit package includes a transparent substrate, a light shielding layer, a quantum dot layer, and a light-emitting unit layer. The light shielding layer is disposed on a first side of the transparent substrate. The light shielding layer includes a plurality of first openings, a plurality of second openings, and a plurality of third openings. The quantum dot layer is disposed on first side of the transparent substrate. The quantum dot layer includes a plurality of first quantum dot units and a plurality of second quantum dot units. Each of the plurality of first quantum dot units is correspondingly disposed in each of the plurality of first openings. Each of the plurality of second quantum dot units is correspondingly disposed in each of the plurality of second openings. The light-emitting unit layer is disposed on one side of the quantum dot layer away from the transparent substrate. The light-emitting unit layer includes a plurality of first light-emitting units, a plurality of second light-emitting units, and a plurality of third light-emitting units with the same light-emitting color. Each of the plurality of first light-emitting units, each of the plurality of second light-emitting units, and each of the plurality of third light-emitting units are disposed corresponding to each of the plurality of first openings, each of the plurality of second openings, and each of the plurality of third openings, respectively. According to the display panel and the display device provided in the present disclosure, since the first light-emitting units, the second light-emitting units and the third light-emitting units emit light of the same color, during the actual preparation process, there is no need to respectively transfer red, green, and blue light-emitting units through mass transfer, which reduces the process difficulty. In addition, the combination of a monochromatic light-emitting unit layer and a quantum dot layer to realize color display can effectively improve the problem of low consistency in light-emitting wavelength and brightness of the M-LED chip of different colors due to the small size of the M-LED chip, thereby improving the display uniformity of the display panel. Furthermore, the light shielding layer can enable the display panel to have an integrated black state in a non-display state, thus avoiding color crosstalk in a display state, realizing uniform surface light-emitting effect, and improving the color difference problem easily generated by a side viewing angle display panel.

In view of the foregoing, the display panel and the preparation method thereof, and display device provided in embodiments of the present disclosure have been described in detail above, and the principles and embodiments of the present disclosure are described by using specific examples herein. Descriptions of the above embodiments are merely intended to help understand the principles and core ideas of the present disclosure. Meanwhile, for a person with ordinary skill in the art, there will be changes in the specific implementation and application scope based on the ideas of the present disclosure. In summary, the content of the specification should not be understood as a limitation of the present disclosure.

What is claimed is:

1. A display panel comprising at least one light-emitting unit package, wherein the at least one light-emitting unit package comprises:

a transparent substrate;

a light shielding layer disposed on a first side of the transparent substrate, the light shielding layer comprises a plurality of first openings, a plurality of second openings, and a plurality of third openings;

a quantum dot layer disposed on the first side of the transparent substrate, the quantum dot layer comprises a plurality of first quantum dot units and a plurality of second quantum dot units, each of the plurality of first quantum dot units is correspondingly disposed in each of the plurality of first openings; and each of the plurality of second quantum dot units is correspondingly disposed in each of the plurality of second openings;

a light-emitting unit layer disposed on one side of the quantum dot layer away from the transparent substrate, the light-emitting unit layer comprises a plurality of first light-emitting units, a plurality of second light-emitting units, and a plurality of third light-emitting units with a same light-emitting color, each of the plurality of first light-emitting units, each of the plurality of second light-emitting units, and each of the plurality of third light-emitting units are disposed corresponding to each of the plurality of first openings, each of the plurality of second openings, and each of the plurality of third openings, respectively;

a color filter layer disposed between the transparent substrate and the quantum dot layer;

a transparent adhesive layer disposed on one side of the quantum dot layer away from the transparent substrate, the transparent adhesive layer comprises a plurality of first transparent adhesive units, a plurality of second transparent adhesive units and a plurality of third transparent adhesive units; and a lens layer disposed in a same layer as the quantum dot layer;

wherein the color filter layer comprises a plurality of first color filter units, a plurality of second color filter units and a plurality of third color filter units; and wherein the lens layer comprises a plurality of lens units correspondingly disposed in each of the plurality of third openings, each of the plurality of lens units is disposed between each of the plurality of third transparent adhesive units and each of the plurality of third color filter units, wherein one side of each of the plurality of lens units away from the transparent substrate is convex.

2. The display panel according to claim 1, wherein each of the plurality of first color filter units is correspondingly disposed in each of the plurality of first openings, and each of the plurality of second color filter units is correspondingly disposed in each of the plurality of second openings; and wherein each of the plurality of first transparent adhesive units is correspondingly disposed in each of the plurality of first openings, each of the plurality of second transparent adhesive units is correspondingly disposed in each of the plurality of second openings, each of the plurality of third transparent adhesive units is correspondingly disposed in each of the plurality of third openings, and the light-emitting unit layer is disposed on one side of the transparent adhesive layer away from the transparent substrate and is fixedly connected with the light shielding layer through the transparent adhesive layer.

3. The display panel according to claim 1, wherein the transparent adhesive layer comprises a base material, and a material of the base material is hot melt adhesive.

4. The display panel according to claim 3, wherein the transparent adhesive layer further comprises light scattering particles doped in the base material.

5. The display panel according to claim 2, wherein each of the plurality of third color filter units is correspondingly disposed in each of the plurality of third openings and is disposed between each of the plurality of third transparent adhesive units and the transparent substrate.

6. The display panel according to claim 1, wherein a refractive index of each of the plurality of lens units is greater than that of each of the plurality of third transparent adhesive units.

7. The display panel according to claim 1, wherein one side of each of the plurality of first quantum dot units away from the transparent substrate and one side of each of the plurality of second quantum dot units away from the transparent substrate are convex.

8. The display panel according to claim 2, wherein a distance between a surface of the transparent adhesive layer away from the transparent substrate and the transparent substrate is a first distance, and a distance between a surface of the light shielding layer away from the transparent substrate and the transparent substrate is a second distance; wherein, the first distance is equal to the second distance, and each of the plurality of first light-emitting units, each of the plurality of second light-emitting units, and each of the plurality of third light-emitting units are disposed outside each of the plurality of first openings, each of the plurality of second openings, and each of the plurality of third openings, respectively;

or, the first distance is less than the second distance, a portion of each of the plurality of first light-emitting units is disposed in each of the plurality of first openings, and a remaining portion of each of the plurality of first light-emitting units is disposed outside each of the plurality of first openings; a portion of each of the plurality of second light-emitting units is disposed in each of the plurality of second openings, and a remaining portion of each of the plurality of second light-emitting units is disposed outside each of the plurality of second openings; and a portion of each of the plurality of third light-emitting units is disposed in each of the plurality of third openings, and a remaining portion of each of the plurality of third light-emitting units is disposed outside each of the plurality of third openings;

or, the first distance is less than the second distance, each of the plurality of first light-emitting units is disposed in each of the plurality of first openings, each of the plurality of second light-emitting units is disposed in each of the plurality of second openings, and each of the plurality of third light-emitting units is disposed in each of the plurality of third openings.

9. The display panel according to claim 1, wherein the light-emitting unit package further comprises an insulating layer disposed on one side of the light-emitting unit layer away from the transparent substrate, and a wiring layer disposed on one side of the insulating layer away from the transparent substrate, wherein the insulating layer is provided with at least one hole at a position corresponding to each of the plurality of first light-emitting units, at least one hole at a position corresponding to each of the plurality of second light-emitting units, and at least one hole at a position corresponding to each of the plurality of third light-emitting units, and the wiring layer comprises a plurality of electrode units, each of the plurality of electrode units is electrically connected to each of the plurality of first light-emitting units, each of the plurality of second light-emitting units, or each of the plurality of third light-emitting units through the at least one hole.

10. The display panel according to claim 9, wherein the display panel further comprises a driving substrate, the at least one light-emitting unit package is disposed on one side of the driving substrate in an array, and the transparent substrate is disposed on one side of the light-emitting unit layer away from the driving substrate.

11. A display device comprising a display panel, the display panel comprises at least one light-emitting unit package, wherein the at least one light-emitting unit package comprises:

a transparent substrate;

a light shielding layer disposed on a first side of the transparent substrate, the light shielding layer comprises a plurality of first openings, a plurality of second openings, and a plurality of third openings;

a quantum dot layer disposed on a first side of the transparent substrate, the quantum dot layer comprises a plurality of first quantum dot units and a plurality of second quantum dot units, each of the plurality of first quantum dot units is correspondingly disposed in each of the plurality of first openings; and each of the plurality of second quantum dot unit is correspondingly disposed in each of the plurality of second openings;

a light-emitting unit layer disposed on one side of the quantum dot layer away from the transparent substrate, the light-emitting unit layer comprises a plurality of first light-emitting units, a plurality of second light-emitting units, and a plurality of third light-emitting units with a same light-emitting color, each of the plurality of first light-emitting units, each of the plurality of second light-emitting units, and each of the plurality of third light-emitting units are disposed corresponding to each of the plurality of first openings, each of the plurality of second openings, and each of the plurality of third openings, respectively;

a color filter layer disposed between the transparent substrate and the quantum dot layer;

a transparent adhesive layer disposed on one side of the quantum dot layer away from the transparent substrate, the transparent adhesive layer comprises a plurality of first transparent adhesive units, a plurality of second transparent adhesive units and a plurality of third transparent adhesive units; and a lens layer disposed in a same layer as the quantum dot layer;

wherein the color filter layer comprises a plurality of first color filter units, a plurality of second color filter units and a plurality of third color filter units; and wherein the lens layer comprises a plurality of lens units correspondingly disposed in each of the plurality of third openings, each of the plurality of lens units is disposed between each of the plurality of third transparent adhesive units and each of the plurality of third color filter units, wherein one side of each of the plurality of lens units away from the transparent substrate is convex.

12. The display device according to claim 11, wherein each of the plurality of first color filter units is correspondingly disposed in each of the plurality of first openings, and each of the plurality of second color filter units is correspondingly disposed in each of the plurality of second openings; and wherein each of the plurality of first transparent adhesive units is correspondingly disposed in each of the plurality of first openings, each of the plurality of second transparent adhesive units is correspondingly disposed in each of the plurality of second openings, each of the plurality of third transparent adhesive units is correspondingly disposed in each of the plurality of third openings, and the light-emitting unit layer is disposed on one side of the transparent adhesive layer away from the transparent substrate and is fixedly connected with the light shielding layer through the transparent adhesive layer.

13. The display device according to claim 11, wherein the transparent adhesive layer comprises a base material, and a material of the base material is hot melt adhesive.

14. The display device according to claim 13, wherein the transparent adhesive layer further comprises light scattering particles doped in the base material.

15. The display device according to claim 12, wherein each of the plurality of third color filter units is correspondingly disposed in each of the plurality of third openings and is disposed between each of the plurality of third transparent adhesive units and the transparent substrate.

16. The display device according to claim 11, wherein a refractive index of each of the plurality of lens units is greater than that of each of the plurality of third transparent adhesive units.

17. The display device according to claim 11, wherein one side of each of the plurality of first quantum dot units and one side of each of the plurality of second quantum dot units away from the transparent substrate are convex.

18. The display device according to claim 12, wherein a distance between a surface of the transparent adhesive layer away from the transparent substrate and the transparent substrate is a first distance, and a distance between a surface of the light shielding layer away from the transparent substrate and the transparent substrate is a second distance; wherein, the first distance is equal to the second distance, and each of the plurality of first light-emitting units, each of the plurality of second light-emitting units, and each of the plurality of third light-emitting units are disposed outside each of the plurality of first openings, each of the plurality of second openings, and each of the plurality of third openings, respectively;

or, the first distance is less than the second distance, a portion of each of the plurality of first light-emitting units is disposed in each of the plurality of first openings, and a remaining portion of each of the plurality of first light-emitting units is disposed outside each of the plurality of first openings; a portion of each of the plurality of second light-emitting units is disposed in each of the plurality of second openings, and a remaining portion of each of the plurality of second light-emitting units is disposed outside each of the plurality of second openings; and a portion of each of the plurality of third light-emitting units is disposed in each of the plurality of third openings, and a remaining portion of each of the plurality of third light-emitting units is disposed outside each of the plurality of third openings;

or, the first distance is less than the second distance, each of the plurality of first light-emitting units is disposed in each of the plurality of first openings, each of the plurality of second light-emitting units is disposed in each of the plurality of second openings, and each of the plurality of third light-emitting units is disposed in each of the plurality of third openings.

19. A display device comprising a display panel, the display panel comprises at least one light-emitting unit package, wherein the at least one light-emitting unit package comprises:

a transparent substrate;

a light shielding layer disposed on a first side of the transparent substrate, the light shielding layer comprises a plurality of first openings, a plurality of second openings, and a plurality of third openings;

a quantum dot layer disposed on a first side of the transparent substrate, the quantum dot layer comprises a plurality of first quantum dot units and a plurality of second quantum dot units, each of the plurality of first quantum dot units is correspondingly disposed in each of the plurality of first openings; and each of the plurality of second quantum dot unit is correspondingly disposed in each of the plurality of second openings;

a light-emitting unit layer disposed on one side of the quantum dot layer away from the transparent substrate, the light-emitting unit layer comprises a plurality of first light-emitting units, a plurality of second light-emitting units, and a plurality of third light-emitting units with a same light-emitting color, each of the plurality of first light-emitting units, each of the plurality of second light-emitting units, and each of the plurality of third light-emitting units are disposed corresponding to each of the plurality of first openings, each of the plurality of second openings, and each of the plurality of third openings, respectively; and a transparent adhesive layer disposed on one side of the quantum dot layer away from the transparent substrate;

wherein the transparent adhesive layer comprises a base material, and a material of the base material is hot melt adhesive; and wherein the transparent adhesive layer further comprises light scattering particles doped in the base material.

* * * * *